(12) United States Patent
Paxton et al.

(10) Patent No.: US 6,873,938 B1
(45) Date of Patent: Mar. 29, 2005

(54) ADAPTIVE LITHOGRAPHIC CRITICAL DIMENSION ENHANCEMENT

(75) Inventors: Theodore A. Paxton, Chandler, AZ (US); Todd Hiar, Gilbert, AZ (US); Wim Tel, Helmond (NL); Todd Davis, Temple, AZ (US)

(73) Assignee: ASML Netherlands B.V., Veldhoven (NL)

( * ) Notice: Subject to any disclaimer, the term of this patent is extended or adjusted under 35 U.S.C. 154(b) by 30 days.

(21) Appl. No.: 10/663,904

(22) Filed: Sep. 17, 2003

(51) Int. Cl.[7] ............................................. G06F 15/00
(52) U.S. Cl. ........................ 702/188; 700/121; 438/33
(58) Field of Search .................. 702/188; 700/99–103, 700/121; 356/490, 493, 500, 509; 257/48; 438/14, 33, 758

(56) References Cited

U.S. PATENT DOCUMENTS

| | | | |
|---|---|---|---|
| 5,079,600 A | * | 1/1992 | Schnur et al. ............... 257/750 |
| 5,229,872 A | | 7/1993 | Mumola |
| 5,296,891 A | | 3/1994 | Vogt et al. |
| 5,324,591 A | * | 6/1994 | Georger et al. ............. 428/552 |
| 5,523,193 A | | 6/1996 | Nelson |
| 5,969,441 A | | 10/1999 | Loopstra et al. |
| 6,046,792 A | | 4/2000 | Van Der Werf et al. |
| 2002/0081758 A1 | | 6/2002 | Iriki |

OTHER PUBLICATIONS

D.G. Flagello et al., "Understanding Systematic and Random CD variations using Predictive Modelling Techniques," *SPIE*, vol. 3679, pp. 162–175.

* cited by examiner

Primary Examiner—John Barlow
Assistant Examiner—Hien Vo
(74) Attorney, Agent, or Firm—Pillsbury Winthrop LLP (57) ABSTRACT

A system, apparatus, and method for improving CD uniformity in lithographic system is presented herein. The system includes an exposure apparatus configured to expose substrates, a track apparatus that is operatively coupled to the exposure apparatus and a plurality of processing modules and apparatus. The system also includes a measuring device configured to measure attributes of the exposed and processed substrates and to assess whether the exposed and processed substrate attributes are uniform based on pre-specified substrate profile information. The system further includes a module configured to adaptively calculate corrective exposure data based on the measured attributes upon determining that said attributes are not uniform. The corrective exposure data is configured to correct for non-uniformities in the substrates by regulating the exposure dosage of the exposure apparatus. Once the substrates are assessed to achieve the desired uniformity, the substrates are exposed by the exposure apparatus in accordance with the corrective exposure data, the uniformity of the exposed substrate continues to be monitored and the dose corrections are updated as required to maintain uniformity.

30 Claims, 6 Drawing Sheets

Examples Pre Exposure Substrate Metrology Data (B306)

Example Initial Dose Map:
Dose Offset = 0 (B316)

FIG. 4E

Example CD Results:
with Dose Offset = 0 (B312)

FIG. 4F

Example Wafer Dose
Layout with Dose Offset (B308)

FIG. 4G

Example CD Results:
with Applied Dose Offset (B312)

FIG. 4H

ADAPTIVE LITHOGRAPHIC CRITICAL DIMENSION ENHANCEMENT

BACKGROUND OF THE INVENTION

1. Field of the Invention

The present invention generally relates to lithographic systems and methods of lithographic exposure.

2. Description of the Related Art

The term "patterning means" as will be employed herein should be broadly interpreted to refer to means that can be used to endow an incoming radiation beam with a patterned cross-section, corresponding to a pattern that is to be created in a target portion of the substrate. The term "light valve" may also be used in this context. Generally, the pattern will correspond to a particular functional layer in a device being created in the target portion, such as an integrated circuit or other device (see below). Examples of such patterning means include:

(a) a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

(b) a programmable mirror array: an example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required; and (c) a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as set forth above. Also, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Lithographic exposure apparatuses can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time.

In current apparatuses, employing patterning by a mask on a mask table, a distinction can be made between two different types of machine. In one type of lithographic exposure apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

It is to be noted that the lithographic apparatus may also be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Among other things, lithographic systems are used in the manufacture of integrated circuits (ICs). Such systems commonly employ a lithographic exposure apparatus and a wafer track apparatus. The lithographic exposure apparatus is configured to project or expose circuit pattern residing on a reticle (e.g., mask) onto a target field of a silicon wafer substrate layer via an irradiating projection beam. The projection beam may encompass different types of electromagnetic radiation including, but not limited to, ultraviolet radiation (UV) and extreme ultra-violet radiation (EUV), as well as particle beams, such as ion beams or electron beams.

Generally, the silicon wafer layer is previously coated with radiation-sensitive material (e.g., resist) that interacts with the impinging projection beam to replicate the profile and features of the mask circuit pattern onto the wafer substrate target fields. In general, a single wafer layer will contain a entire network of adjacent target fields that are successively irradiated.

Current lithographic exposure apparatuses fall into two general categories: stepper tools and step-and-scan tools. In steppers, each target portion is irradiated by exposing the entire mask pattern onto the target portion at once. In step-and-scan tools, each target portion is irradiated by progressively scanning the mask circuit pattern under the projection beam in a given reference direction while synchronously scanning the substrate.

Irrespective of the tool used, the substrate may be subjected to a variety of processes before the exposure process. For example, as indicated above, the substrate will generally be treated with resist before exposure. Also, prior to exposure, the substrate may be subjected to cleaning, etching, ion implantation (e.g., doping), metallization, oxidation, chemo-mechanical polishing, priming, resist coating, soft bake processes, and measurement processes.

The substrate may also be subjected to a host of post-exposure processes, such as, for example, post exposure bake (PEB), development, hard bake, etching, ion implantation (e.g., doping), metallization, oxidation, chemo-mechanical polishing, cleaning, and measurement processes. And, if several layers are required, which is usually the case, the entire procedure, or variants thereof, will have to be repeated for each new layer.

These pre- and post-exposure processes are performed by stations or modules designed for their respective purposes. The substrate is subjected to these processing modules, as well as the lithographic exposure apparatus, in a pre-defined sequence. In this arrangement, the substrate wafers travel in a pre-specified processing path to get serviced by specific processing modules that can be tracked. The processing path can be monitored, recorded, controlled, and limited to specific paths.

Figure 1A:
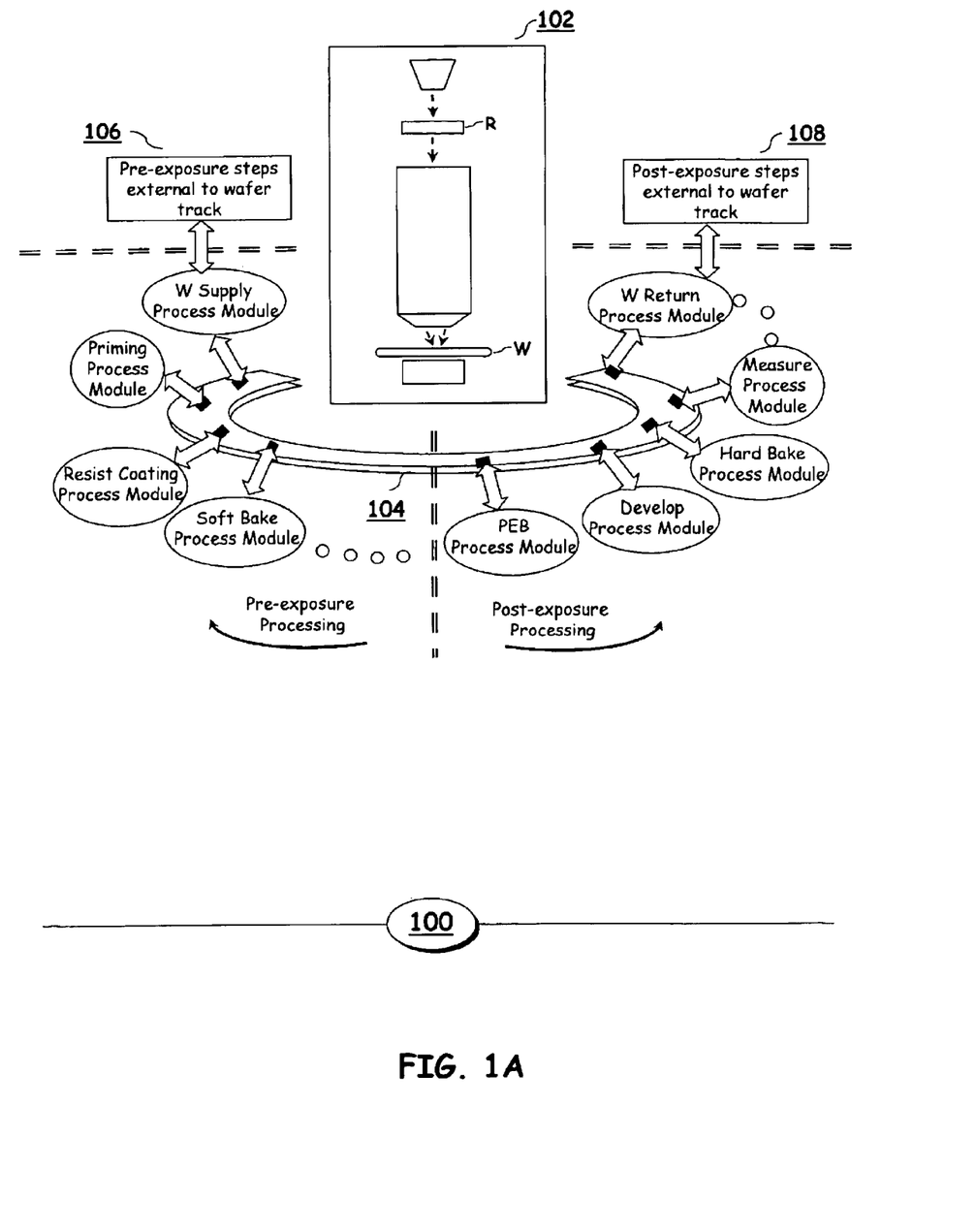
FIG. 1A is a schematic illustration of a lithographic system.

As indicated in FIG. 1A, which schematically depicts lithographic system 100, wafer track apparatus 104 interconnects lithographic exposure apparatus 102 with a host of pre-processing modules 104, 106 and post exposure processing modules 104, 108. The pre- and post-exposure processing modules 104, 106, 108 can be apparatus that are external to the wafer track apparatus or modules that are internal to the wafer track apparatus. To accommodate the transfer of substrates between these processing steps the wafer track apparatus 104 may also include interface sections configured to transport the wafer substrates to and from lithographic exposure apparatus 102, pre-processing apparatus 106, post-processing apparatus 108, and transport the wafer substrates between the various processing modules internal to the wafer track apparatus 104. Pre-exposure processes external to the wafer track 106 may include, for example, cleaning, etching, ion implantation (e.g., doping), metallization, oxidation, chemo-mechanical polishing, and measurement apparatus. Pre-exposure process modules internal to the wafer track 104 may include, for example, wafer supply, resist coating, measurement, and soft bake modules. Post-processing modules internal to the wafer track 104 may include, for example, post-exposure bake (PEB), develop, hard bake, and measurement modules. Post-exposure processes external to the wafer track 108 may include, for example, cleaning, etching, ion implantation (e.g., doping), metallization, oxidation, chemo-mechanical polishing, and measurement apparatus.

Needless to say, it is important that the features and profile of the pattern exposed on the target field of the wafer substrate layer are replicated as accurately as possible. To this end, manufacturers normally specify key attributes, which can collectively be considered the critical dimension (CD) of the exposed pattern, in order to characterize the features and profile of the pattern and establish a benchmark level of quality and uniformity. The CD metric may include, for example, the gap between features, X and/or Y diameter of holes and/or posts, ellipticity of holes and/or posts, area of feature, feature sidewall angle, width at the top of a feature, width at the middle of a feature, width at the bottom of a feature, and line edge roughness.

There are, however, numerous activities during the lithographic fabrication process that affect the critical dimension uniformity (CDU) and compromise the quality of the exposed pattern. Indeed, the very pre- and post-exposure processes that service and treat the substrate wafers along the wafer track apparatus, such as, for example, the post exposure bake (PEB) processing module, contribute to variations in the CDU. Such variations may occur across a target field, across a wafer, and between wafers and ultimately result in loss of yield.

SUMMARY OF THE INVENTION

Systems, apparatuses and methods consistent with the principles of the present invention, as embodied and broadly described herein, provide for the improvement of CD uniformity in a lithographic system that employs an exposure apparatus and a track apparatus. In one embodiment, the invention measures the attributes of substrates processed by the lithographic system, assesses whether the processed substrates CDs are uniform based on pre-specified CD criteria and, in response to determining that the CDs are not uniform, corrective exposure data are adaptively calculated based on the measured CD attributes. The corrective exposure data is configured to correct non-uniformities in the substrates by regulating the exposure dosage in the exposure apparatus of the lithographic system. The substrates are then exposed by the exposure apparatus of the lithographic system in accordance with the corrective exposure data.

Although specific reference may be made in this text to the use of the apparatus according to the invention in the manufacture of IC's, it should be explicitly understood that such apparatus has many other possible applications. For example, it may be employed in the manufacture of integrated optical systems, guidance and detection patterns for magnetic domain memories, liquid-crystal display panels, thin-film magnetic heads, etc.

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

As noted above, processes that treat the substrate wafers contribute to variations in CDU that negatively affect the quality and performance of the exposed patterns. Such non-uniformities may occur across a target field, across a wafer, and between wafers. Moreover, these non-uniformities can also vary depending a variety of factors, such as the particular path the substrate wafer travels, scheduling anomalies, etc. As described in greater detail below, the present invention contemplates a lithographic system that employs an adaptive CD enhancement process whereby these variations and non-uniformities are factored out to provide acceptable CDU levels. Such a process exploits information regarding the lithographic system, for example, wafer track processing data, metrology data, and/ or substrate wafer history data, to iteratively arrive at and maintain the optimal corrective dose offsets that improve overall CDU performance.

FIG. 1A schematically depicts lithographic system 100 according to a particular embodiment of the invention. System 100 comprises lithographic exposure apparatus 102, which is configured to expose a pattern onto a substrate wafer, and wafer track apparatus 104, which is configured to transport the substrate wafers between the various pre- and post-exposure processing modules.

Figure 1B:
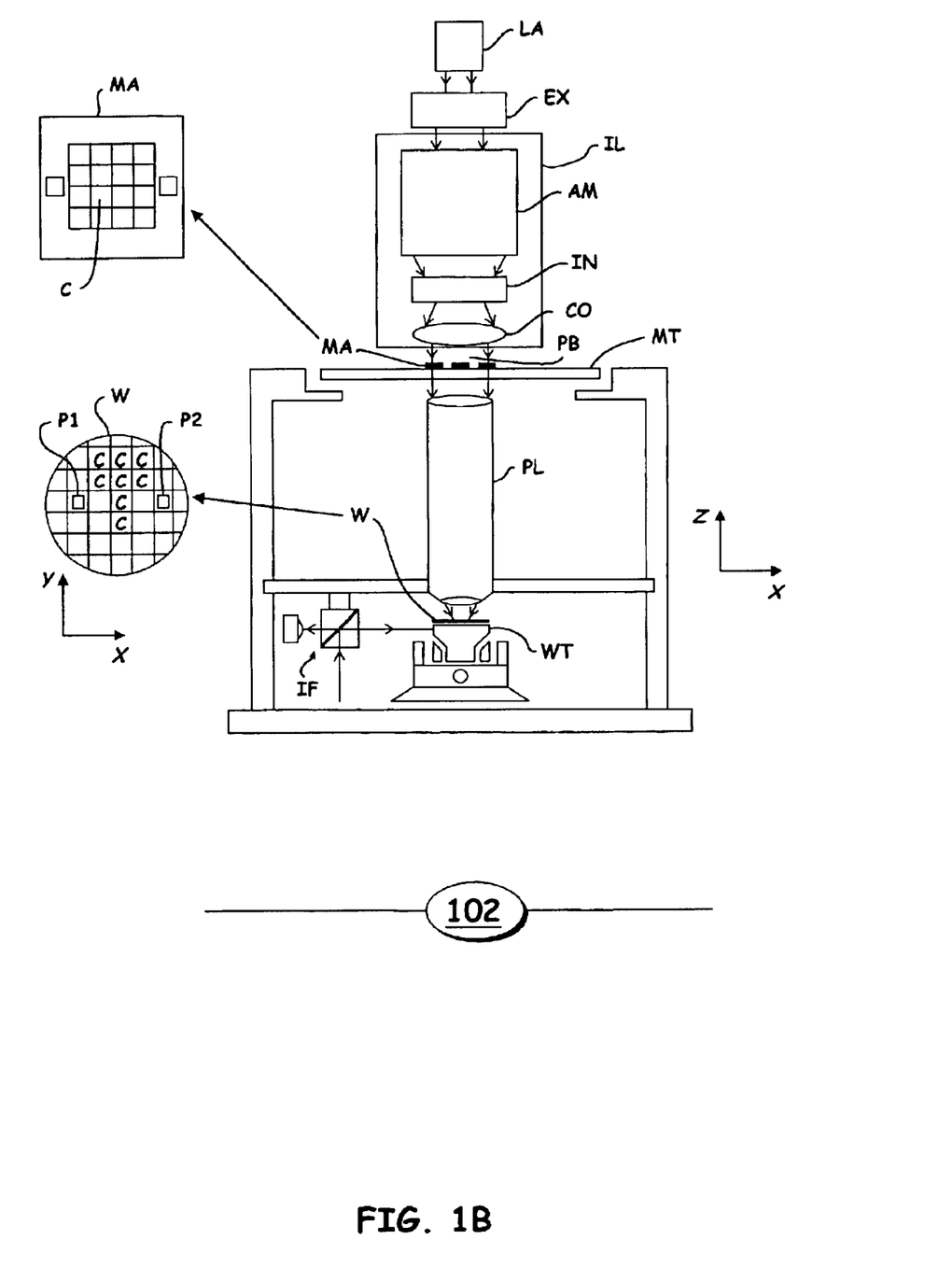
FIG. 1B is a schematic illustration of a lithographic projection apparatus.

FIG. 1B provides a more detailed illustration of lithographic apparatus 102. As indicated in FIG. 1B, lithographic apparatus 102 includes radiation source LA and radiation system IL for providing a projection beam PB, a first object table (e.g. mask table) MT provided with a mask holder for holding a mask MA (e.g. a reticle), and a projection system PL (e.g., lens) for imaging an irradiated portion of the mask MA onto a target portion C (e.g. comprising one or more dies) of the substrate W. As depicted, lithographic apparatus 102 is of a transmissive type (i.e. has a transmissive mask). However, in general, it may also be of a reflective type, for example (with a reflective mask) and, alternatively, apparatus 102 may employ another kind of patterning means, such as a programmable mirror array of a type as indicated above.

Lithographic apparatus 102 further comprises a second object table (e.g., substrate table) WT provided with a substrate holder for holding a substrate W (e.g. a resist-coated silicon wafer).

Source LA produces a beam of radiation, which is fed into illumination system (e.g., illuminator) IL, either directly or after having traversed conditioning means, such as a beam expander EX, for example. Illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired cross-sectional uniformity and intensity distribution.

It is to be noted with regard to FIG. 1B, that source LA may be within the housing of lithographic exposure apparatus 102 (as is often the case when the source LA is a mercury lamp, for example). However, it may also be remote from apparatus 102, as in the case of an excimer laser source. In this scenario, the remote radiation beam is guided into apparatus 102 by virtue of suitable directing mirrors. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately (e.g. so as to position different target portions C in the path of the beam PB). Similarly, the first positioning means can be used to accurately position the mask MA with respect to the path of the beam PB (e.g. after mechanical retrieval of the mask MA from a mask library, or during a scan).

In general, movement of the object tables MT, WT will be realized with the aid of a long-stroke module (course positioning) and a short-stroke module (fine positioning), which are not explicitly depicted in FIG. 1B. However, in the case of a wafer stepper (as opposed to a step-and-scan apparatus), the mask table MT may just be connected to a short stroke actuator, or may be fixed.

Lithographic apparatus 102 can be used in two different modes:

(a) step mode: mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and (b) scan mode: essentially the same scenario applies, except that a given target portion C is not exposed in a single "flash". Instead, mask table MT is movable in a given direction (the so-called "scan direction", e.g. the y direction) with a speed v, so that projection beam PB is caused to scan over a mask image. Concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
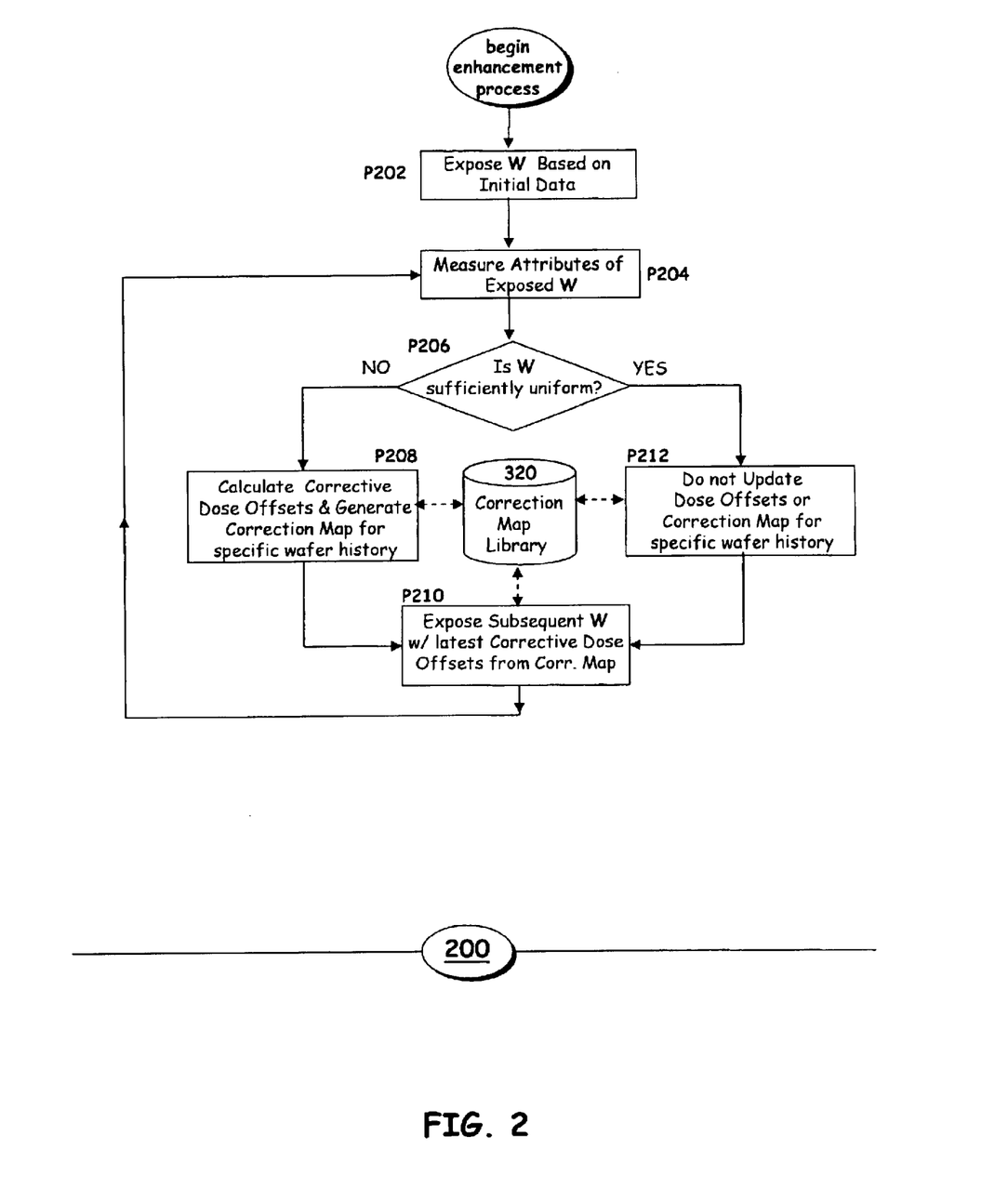
FIG. 2 is a high level flow diagram depicting an embodiment of the present invention.

FIG. 2 schematically depicts the general inventive concept of adaptive CD enhancement process 200, constructed and operative in accordance with a particular embodiment of the present invention. As indicated in FIG. 2, enhancement process 200 commences with procedure task P202 which, via lithographic exposure apparatus 102, exposes a substrate wafer W based on associated initial exposure information. This associated initial information may include pre-exposure wafer measurement data, initial exposure dosing requirements, wafer track processing data that may include the pre-specified path wafer W will travel, and metrology data see FIG. 4 for an example.

After exposing the wafer W in accordance with the initial exposure information, attributes of the exposed wafer W are measured in procedure task P204. Measurement task P204 may be configured to measure and assess a host of wafer attributes and artifacts that relate to CD uniformity, such as the average feature size of the entire substrate, the size of the individual target fields, the thickness of the resist, thickness of the anti-reflective coating, the gap between features, X and/or Y diameter of holes and/or posts, ellipticity of holes and/or posts, area of feature, width at the top of a feature, width at the middle of a feature, width at the bottom of a feature, feature sidewall angle, line edge roughness, etc. see FIG. 5 for examples. These measurement may be performed by scanning electron microscope (SEM), spectroscopic ellipsometer, reflectometer, electric line width measurement (ELM), focused ion beam (FIB), e-Beam, atomic force microscope (AFM), scatterometer, defect inspection tool, overlay measurement tool, etc.

Based on the measured attributes of the exposed wafer W in procedure task P206, process 200 determines whether the wafer is sufficiently uniform. The sufficiency of CDU may be based on a plurality of metrics or pre-specified profile characteristics, such as, for example, CD range, CD standard deviation, average CD range between fields. If the wafer W is sufficiently uniform, as specified by the relevant metrics, procedure task P212 which archives and updates the archived correction map library 320 to indicate that no changes are required in the exposure dose offsets and the subsequent wafers will be processed with the existing exposure information.

If, on the other hand, wafer W is not sufficiently uniform, process 200 progresses to procedure task P208, where it adaptively compensates for the lack of CDU by generating a map of corrective exposure dose offsets. This correction map regulates the exposure levels employed by lithographic exposure apparatus 102 to correct for the variations in the wafer W CDU. As indicated in FIG. 2, this correction map is archived or stored in a correction map library 320 in order to facilitate the enhanced processing of subsequent wafers.

In procedure task 210, a subsequent wafer W is exposed with the latest corrective exposure dose offsets stored in correction map library 320 that correlates to the wafer history. After exposure, process 200 returns to procedure task P204 to measure the attributes of the subsequent wafer W (e.g., CD), that was exposed with the corrective dose offsets established for the specific wafer history. Process 200 then iterates to procedure task P206 to determine whether the attributes of wafer W are sufficiently uniform and, if not, an updated map of corrective exposure dose offsets are generated for each specific wafer history condition with control limits to minimize over or under correction. Process 200 continues this iterative process until a subsequent exposed wafer W achieves the desired CDU profile. With each iteration, correction map library 320 is revised with the latest, updated corrective exposure dose offsets so that once the desired CDU profile is achieved, all subsequent wafers will be exposed with the same updated correction map. Process 200 will continue to monitor the CDU and update corrections as necessary based on the measured results.

By adaptively adjusting the corrective exposure dose offsets, process 200 effectively converges on the optimal corrective dose offsets to factor out wafer W variations and non-uniformities, resulting in improved CDU levels. In addition process 200 continues to monitor the CDU levels for changes over time and will calculate and implement dose adjustments as required.

Figure 3:
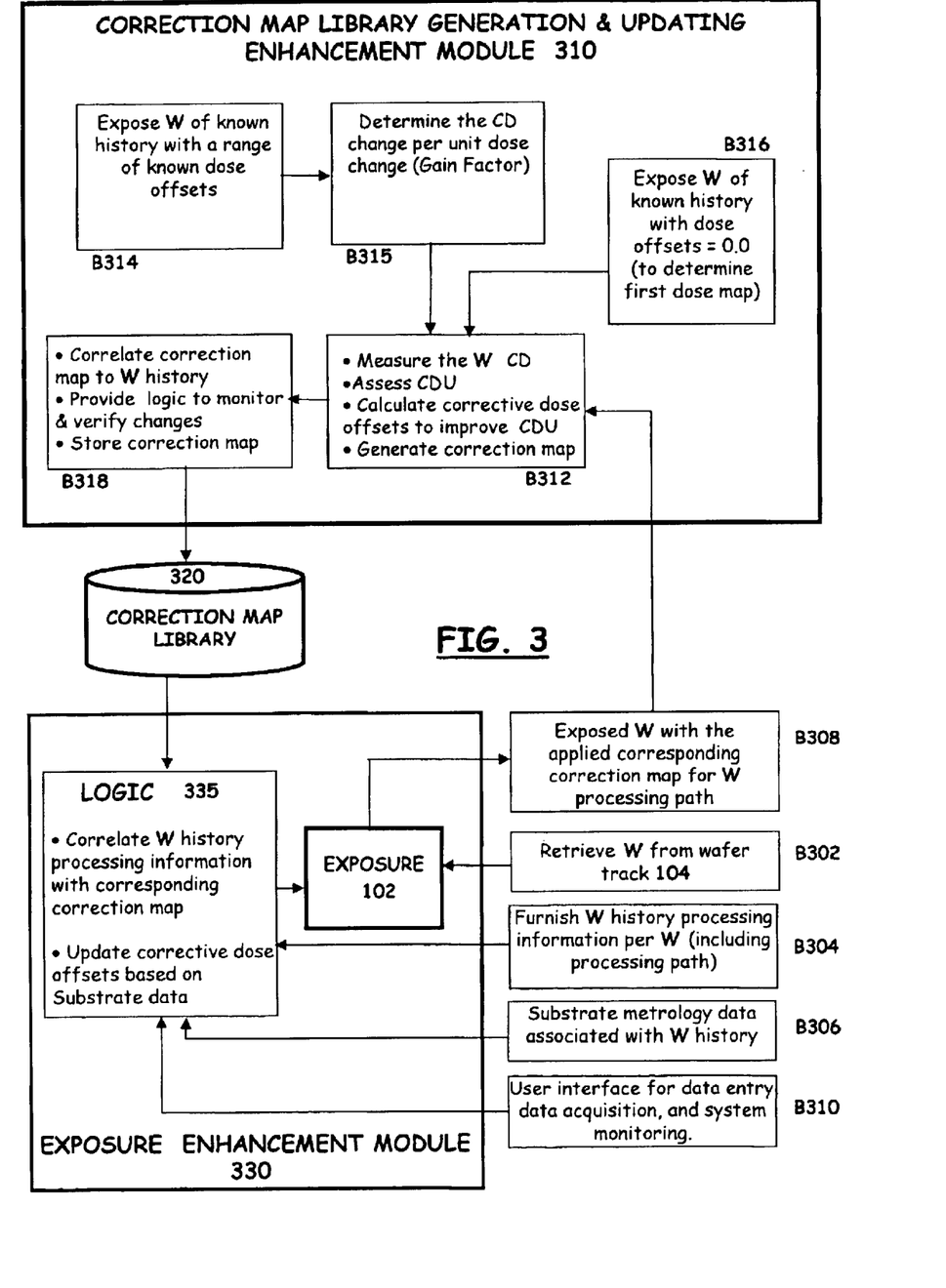
FIG. 3 is a schematic functional block diagram depicting an embodiment of the present invention.

FIG. 3 provides a schematic functional block diagram detailing certain features and aspects of the invention described above. As depicted in FIG. 3, the adaptive CD enhancement process utilizes an exposure enhancement module 330, a correction map library enhancement module 310, and the aforementioned correction map library 320. These modules cooperate with each other in an adaptive manner to achieve the optimal corrective dose offsets.

Exposure enhancement module 330 relates to features and aspects of the exposure functionality and includes logical mechanism 330 which, as described in greater detail below, is configured to provide monitoring, verification, and correlation functionality. Correction map library enhancement module 310 relates to features and aspects regarding the calculation of corrective exposure dose offsets and the generation and updating of correction maps.

Figure 4A:
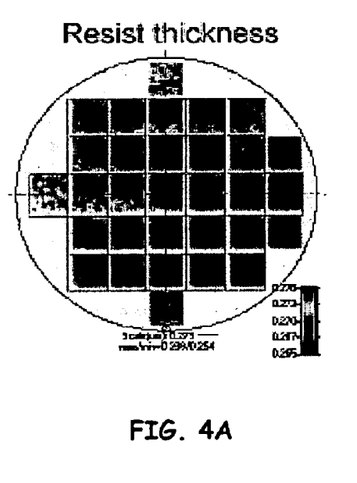
FIGS. 4A, 4B illustrate examples of pre-exposure metrology data.
Figure 4B:
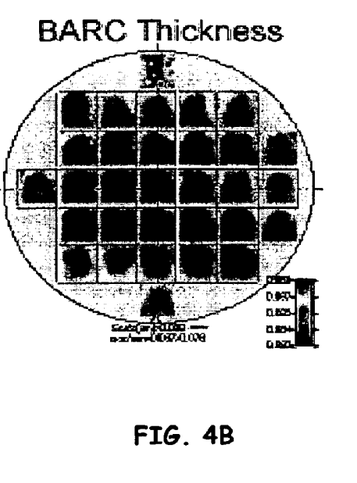

As indicated by functional block B302 of FIG. 3, a substrate wafer W is retrieved from wafer track apparatus 104, exposed by lithographic exposure apparatus 102 in accordance with associated exposure information resulting in an exposed W as indicated by functional block B308. The exposure information is supplied to, and processed by, logic mechanism 335. As discussed above and indicated by functional blocks B304–B306, such information may include wafer track processing data containing the wafer history, modules and apparatus the wafer has been processed with, modules and apparatus the wafer will be processed with after exposure, film thickness, and metrology data. Exposure information may also include pre-exposure wafer measurement data, initial exposure dosing requirements, and similar lithographic data. Examples of pre-exposure metrology data are illustrated in FIGS. 4A, 4B.

Logic mechanism 335 correlates the wafer history, current substrate data, and exposure information with the information stored in the correction map library 320 to determine the corresponding dose correction map that will be used in the exposure apparatus 102. For the initial wafer W exposure, logic mechanism 335 applies no dose correction B316, unless input via the user interface B310, since no prior correction map is available. After the initial wafer exposure, logic mechanism 335 correlates the wafer processing history with the corresponding correction map, updates the corrective dose offsets, and monitors and verifies changes to the correction maps.

As indicated by functional blocks B308 and B312, after exposing the wafer W in accordance with the associated exposure information, attributes of the exposed wafer W are measured, CDU is assessed, corrective dose offsets are calculated, and these offsets are generated into correction map.

As indicated by functional block B312, measured attributes include the CD of the wafer W as well as the CD of the individual target fields. As discussed above, other attributes that relate to CDU may also be measured, such as, for example, thickness of the resist, thickness of the anti-reflective coating, the gap between features, X & Y diameter of holes, CD sidewall angle, top-CD, middle-CD, bottom-CD, line edge roughness, etc. These measurement may be performed by scanning electron microscope (SEM), spectroscopic ellipsometer, reflectometer, electric line width measurement (ELM), focused ion beam (FIB), e-Beam, atomic force microscope (AFM), scatterometer, defect inspection tool, overlay measurement tool, etc.

Once the relevant attributes have been measured, an assessment is made to determine whether the wafer and/or individual target fields are sufficiently uniform in accordance with a pre-specified profile characteristic or metric, such as, for example, CD range, CD standard deviation, average CD range between fields. If wafer W is not sufficiently uniform, corrective exposure dose offsets are calculated to correct for the variations in the wafer W CDU. As discussed above, the corrective exposure dose offsets regulate the exposure dosage levels employed by lithographic exposure apparatus 102.

Figure 4C:
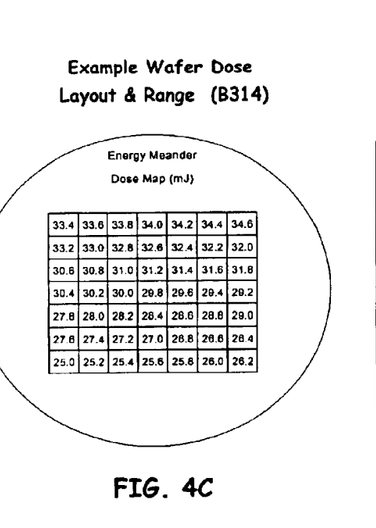
FIGS. 4C, 4D illustrate a typical dose layout used to determine the gain factor for the process and the corresponding wafer CD change per unit dose, respectively.

In calculating the corrective exposure dose offsets, preliminary calculations are performed, as indicated by functional blocks B314–B316, to determine baseline gain factors using known correction offsets. The gain factors for the process are determined by exposing a wafer W with the corrective exposure dose offsets replaced with a range of fixed dose offsets of known magnitude in functional block B314. FIG. 4C illustrates a typical dose layout and range, as indicated by functional block B314.

Figure 4D:
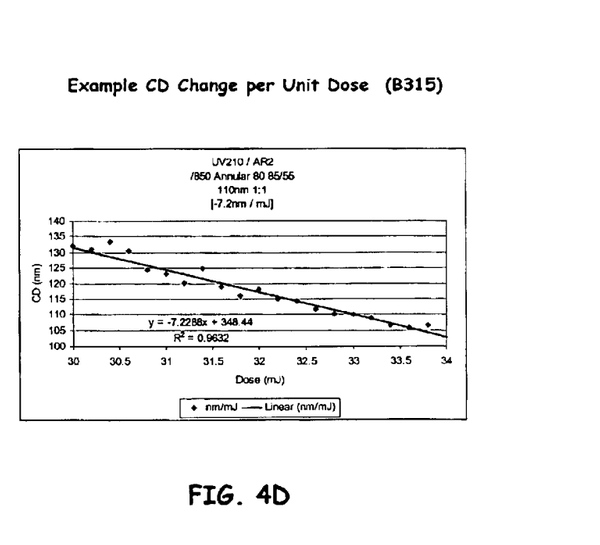
Figure 4E:
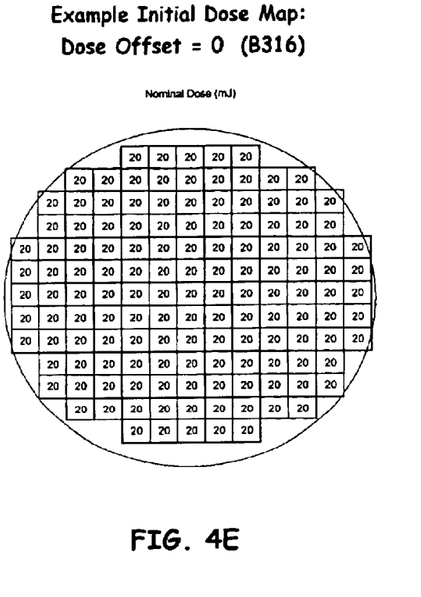
FIGS. 4E, 4F illustrate a typical dose layout with dose offsets set to zero and the corresponding results of a wafer CD, respectively.
Figure 4F:
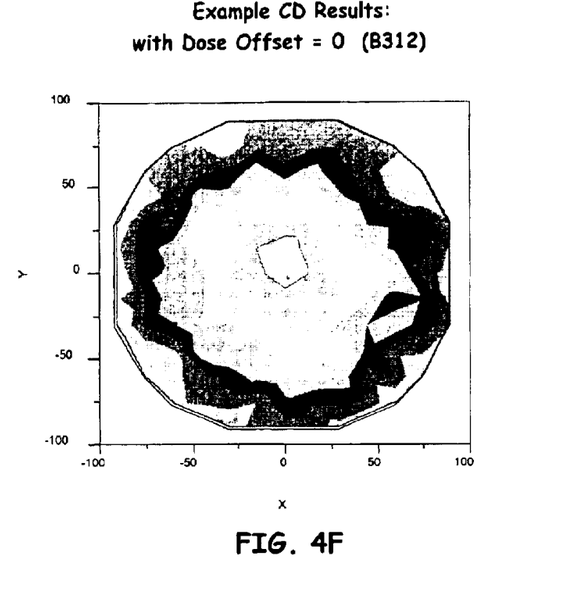

The resulting wafer W is measured and CD change per unit exposure dosage (gain factor) is calculated B315. FIG. 4D illustrates a typical CD change per unit exposure dosage, as calculated by functional block B315. The initial dose map is determined by exposing a wafer with a specific history with the corrective exposure dose offsets set to zero, as indicated by functional block B316, for the initial iteration. FIG. 4E illustrates a typical dose layout with dose offsets set to zero, as indicated by functional block B316 and FIG. 4F illustrates the results of the wafer W CD with the dose offsets set to zero.

Subsequently, as indicated in functional block B318, the correction map is correlated to the history of the corresponding wafer W and any change to the correction maps is monitored and confirmed. In addition, the correlated and confirmed correlation map is stored in correction map library 320.

As indicated in FIG. 3, the stored correction map corresponding to each wafer path is supplied to logic mechanism 335 where, as noted above, the wafer processing path is correlated with the corresponding correction map and the correction maps for each wafer W path is updated. This information is then supplied to lithographic exposure apparatus 102 for exposing subsequent wafers Ws.

Figure 4G:
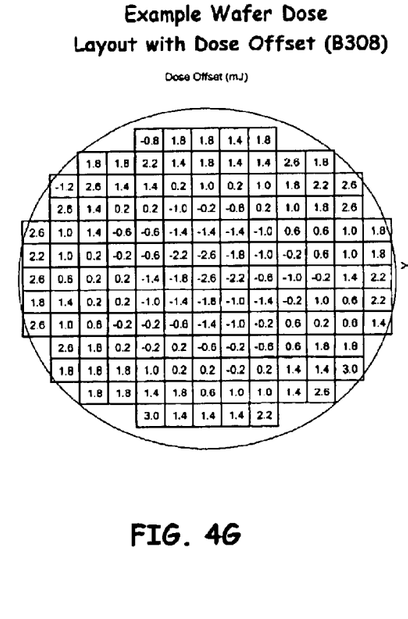
FIGS. 4G, 4H illustrate a typical optimal corrected dose layout and the corresponding result of a wafer CD, respectively.
Figure 4H:
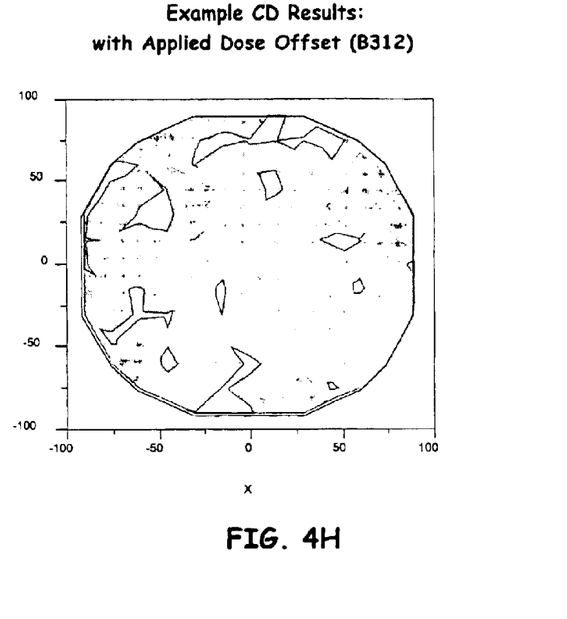

As discussed above, the adaptive CD enhancement process iterates to progressively generate revised corrective exposure dose offset values and update the correction map library until an exposed wafer W is assessed to have the desired CDU, indicating that the optimal corrective dose offsets have been achieved. FIG. 4G illustrates a typical optimal corrected dose layout, captured at functional block B308 after two iterations, measured at functional block 312 and FIG. 4H illustrates the results of the wafer W CD with optimal corrected dose layout. At that point, subsequent wafers are exposed with the same updated correction map and the processed continues to be monitored. If the CDU drifts from the desired CDU, the process will identify this situation, calculate an improved dose correction map, and apply them to the exposure to continuously maintain optimal CDU. As indicated by functional block B310, data gathered and decisions made during this process are made available to the user electronically and/or visually to allow manually or automatic monitoring of the system. In addition functional block B310 allows the user to input information, and optimize the application of this invention.

In this manner, the adaptive process converges to the optimal corrective dose offsets, monitors the process, and corrects for changes in the process over time. In doing so, the wafer W variations and non-uniformities occurring across a target field, across a wafer, and between wafers are effectively corrected to yield the desired CDU profile.

The following detailed description refers to the accompanying drawings that illustrate exemplary embodiments consistent with the present invention. Other embodiments are possible and modifications may be made to the embodiments without departing from the spirit and scope of the invention. For example, the embodiments described below may, instead, be implemented in different embodiments of software, firmware, and hardware in the entities illustrated in the figures. As such, the operation and behavior of the present invention will be described with the understanding that modifications and variations of the embodiments are possible, given the level of detail present herein. Thus, the following detailed description is not meant or intended to limit the invention—rather the scope of the invention is defined by the appended claims.

What is claimed is:

1. A method of improving attribute uniformity of substrates processed by a lithographic system having exposure apparatus to expose substrates, pre-exposure apparatus to process substrates prior to exposure, and post-exposure apparatus to process substrates after exposure, said method comprising:

measuring attributes of substrates processed by said lithographic system;

assessing whether said measured substrate attributes are uniform based on pre-specified substrate profile information;

adaptively calculating corrective exposure data based on said measured substrate attributes upon determining that said measured substrate attributes are not uniform, said corrective exposure data configured to correct non-uniformities of said substrate attributes by regulating exposure dosage in said exposure apparatus of said lithographic system; and exposing substrates in accordance with said corrective exposure data.

2. The method of claim 1, further including storing collections of said corrective exposure data as correction maps.

3. The method of claim 2, wherein said adaptive calculation of corrective exposure data includes, acquiring processing module information based on information of specific apparatus of said pre-exposure apparatus and post-exposure apparatus used in processing said substrates, acquiring metrology information including information associated with said specific apparatus of said pre-exposure apparatus and post-exposure apparatus used in processing said substrates, determining exposure dosage gain factor, acquiring history of previously-processed substrates, correlating each of said correction maps to at least one of said processing module information, said metrology information, said substrate history, said exposure dosage gain factor, and said measured substrate attributes, iteratively calculating and updating said corrective exposure data based on at least one of said processing module information, said metrology information, said substrate history, said exposure dosage gain factor, and said measured substrate attributes, wherein said iterative corrective exposure data calculation and updating continues until said substrate attributes are determined to be uniform.

4. The method of claim 3, further including, monitoring and verifying said correction map correlations by a logic mechanism, and communicating, by said logic mechanism, with at least one of said correction maps, said processing module information, said metrology information, said substrate history, said exposure dosage gain factor, and said measured substrate attributes.

5. The method of claim 4, further including, monitoring, by said logic mechanism, said substrate attributes upon determining that said substrate attributes are uniform, and initiating, by said logic mechanism, invocation of corrective exposure data calculation and updating upon determining that said substrate attributes are no longer uniform.

6. The method of claim 3, wherein said processing module information further includes data associated with processing path of said substrates processed by said specific apparatus of said pre-exposure apparatus and post-exposure apparatus.

7. The method of claim 5, wherein said iterative corrective exposure data calculation and updating, said monitoring of said substrate attributes, and said initiating invocation of corrective exposure data calculation and updating are controlled by said logical mechanism.

8. The method of claim 3, wherein said determining exposure dose gain factor includes determining change in said measured attributes of said substrates per unit of exposure dosage.

9. The method of claim 7, further including providing a user interface to communicate information regarding at least one of said exposure apparatus, said pre-exposure apparatus, said post-exposure apparatus, said correction maps, said processing module information, said metrology information, said substrate history, said exposure dosage gain factor, said measured substrate attributes, and said logical mechanism.

10. The method of claim 2, further including,
acquiring processing module information based on information of specific apparatus of said pre-exposure apparatus and post-exposure apparatus and processing paths used in processing said substrates,
acquiring metrology information including information associated with said specific apparatus of said pre-exposure apparatus and post-exposure apparatus used in processing said substrates,
determining exposure dosage gain factor including calculating change in said measured attributes of said substrates per unit of exposure dosage,
acquiring history of previously-processed substrates,
correlating each of said correction maps to at least one of said processing module information, said metrology information, said substrate history, said exposure dosage gain factor, and said measured substrate attributes,
iteratively calculating and updating said corrective exposure data based on at least one of said processing module information, said metrology information, said substrate history, said exposure dosage gain factor, and said measured substrate attributes, and
providing a logical mechanism,
wherein said logical mechanism monitors, controls, and enables said iterative corrective exposure data calculation and updating to continue until said substrate attributes are determined to be uniform upon determining that said substrate attributes are uniform, and
wherein said logical mechanism initiates invocation of corrective exposure data calculation and updating upon determining that said substrate attributes are no longer uniform.

11. A lithographic system that improves attribute uniformity of substrates, comprising:
exposure apparatus configured to expose substrates;
pre-exposure apparatus configured to process substrates prior to exposure;
track apparatus operatively coupled to said exposure apparatus and a plurality of processing modules;
post-exposure apparatus configured to process substrates after exposure;
a measuring device configured to measure attributes of said substrates; and
a corrective exposure module that adaptively calculates corrective exposure data based on said measured attributes upon determining that said substrates are not uniform,
wherein said corrective exposure data are configured to correct non-uniformities in said substrates by regulating exposure dosage in said exposure apparatus, and
wherein said substrates are exposed by said exposure apparatus in accordance with said corrective exposure data.

12. The system of claim 11, wherein collections of said corrective exposure data are stored as correction maps in a correction map library.

13. The system of claim 12, wherein said adaptive calculation of corrective exposure data of said corrective exposure module includes,
acquiring processing module information based on information of specific apparatus of said pre-exposure apparatus and post-exposure apparatus used in processing said substrates,
acquiring metrology information including information associated with said specific apparatus of said pre-exposure apparatus and post-exposure apparatus used in processing said substrates,
determining exposure dosage gain factor,
acquiring history of previously-processed substrates,
correlating each of said correction maps to at least one of said processing module information, said metrology information, said substrate history, said exposure dosage gain factor, and said measured substrate attributes,
iteratively calculating and updating said corrective exposure data based on at least one of said processing module information, said metrology information, said substrate history, said exposure dosage gain factor, and said measured substrate attributes,
wherein said iterative corrective exposure data calculation and updating continues until said substrate attributes are determined to be uniform.

14. The system of claim 13, further including a logical mechanism to monitor and verify said correction map correlations, said logical mechanism configured to communicate with at least one of said correction maps, said processing module information, said metrology information, said substrate history, said exposure dosage gain factor, and said measured substrate attributes.

15. The system of claim 14, wherein said logic mechanism monitors said substrate attributes upon determining that said substrate attributes are uniform, and initiates invocation of corrective exposure data calculation and updating upon determining that said substrate attributes are no longer uniform.

16. The system of claim 13, wherein said processing module information further includes data associated with processing path of said substrates processed by said specific apparatus of said pre-exposure apparatus and post-exposure apparatus.

17. The system of claim 15, wherein said iterative corrective exposure data calculation and updating, said monitoring of said substrate attributes, and said initiating invocation of corrective exposure data calculation and updating are controlled by said logical mechanism.

18. The system of claim 13, wherein said determining exposure dose gain factor includes determining change in said measured attributes of said substrates per unit of exposure dosage.

19. The system of claim 17, further including a user interface to communicate information regarding at least one of said exposure apparatus, said pre-exposure apparatus, said post-exposure apparatus, said correction maps, said processing module information, said metrology information, said substrate history, said exposure dosage gain factor, said measured substrate attributes, and said logical mechanism.

20. The system of claim 12, wherein said adaptive calculation of corrective exposure data of said corrective exposure module includes,
acquiring processing module information based on information of specific apparatus of said pre-exposure apparatus and post-exposure apparatus and processing paths used in processing said substrates, acquiring metrology information including information associated with said specific apparatus of said pre-exposure apparatus and post-exposure apparatus used in processing said substrates, determining exposure dosage gain factor including calculating change in said measured attributes of said substrates per unit of exposure dosage, acquiring history of previously-processed substrates, correlating each of said correction maps to at least one of said processing module information, said metrology information, said substrate history, said exposure dosage gain factor, and said measured substrate attributes, iteratively calculating and updating said corrective exposure data based on at least one of said processing module information, said metrology information, said substrate history, said exposure dosage gain factor, and said measured substrate attributes, and providing a logical mechanism, wherein said logical mechanism monitors, controls, and enables said iterative corrective exposure data calculation and updating to continue until said substrate attributes are determined to be uniform upon determining that said substrate attributes are uniform, and wherein said logical mechanism initiates invocation of corrective exposure data calculation and updating upon determining that said substrate attributes are no longer uniform.

21. A computer readable program storage device encoded with instructions that, when executed by a computer, performs a process of improving attribute uniformity of substrates processed by a lithographic system having exposure apparatus to expose substrates, pre-exposure apparatus to process substrates prior to exposure, and post-exposure apparatus to process substrates after exposure, said process comprising:

measuring attributes of substrates processed by said lithographic system;

assessing whether said measured substrate attributes are uniform based on pre-specified substrate profile information;

adaptively calculating corrective exposure data based on said measured substrate attributes upon determining that said measured substrate attributes are not uniform, said corrective exposure data configured to correct non-uniformities of said substrate attributes by regulating exposure dosage in said exposure apparatus of said lithographic system; and exposing substrates in accordance with said corrective exposure data.

22. The computer readable program storage device of claim 21, further including storing collections of said corrective exposure data as correction maps.

23. The computer readable program storage device of claim 22, wherein said adaptive calculation of corrective exposure data includes, acquiring processing module information based on information of specific apparatus of said pre-exposure apparatus and post-exposure apparatus used in processing said substrates, acquiring metrology information including information associated with said specific apparatus of said pre-exposure apparatus and post-exposure apparatus used in processing said substrates, determining exposure dosage gain factor, acquiring history of previously-processed substrates, correlating each of said correction maps to at least one of said processing module information, said metrology information, said substrate history, said exposure dosage gain factor, and said measured substrate attributes, iteratively calculating and updating said corrective exposure data based on at least one of said processing module information, said metrology information, said substrate history, said exposure dosage gain factor, and said measured substrate attributes, wherein said iterative corrective exposure data calculation and updating continues until said substrate attributes are determined to be uniform.

24. The computer readable program storage device of claim 23, further including, monitoring and verifying said correction map correlations by a logic mechanism, and communicating, by said logic mechanism, with at least one of said correction maps, said processing module information, said metrology information, said substrate history, said exposure dosage gain factor, and said measured substrate attributes.

25. The computer readable program storage device of claim 24, further including, monitoring, by said logic mechanism, said substrate attributes upon determining that said substrate attributes are uniform, and initiating, by said logic mechanism, invocation of corrective exposure data calculation and updating upon determining that said substrate attributes are no longer uniform.

26. The computer readable program storage device of claim 23, wherein said processing module information further includes data associated with processing path of said substrates processed by said specific apparatus of said pre-exposure apparatus and post-exposure apparatus.

27. The computer readable program storage device of claim 25, wherein said iterative corrective exposure data calculation and updating, said monitoring of said substrate attributes, and said initiating invocation of corrective exposure data calculation and updating are controlled by said logical mechanism.

28. The computer readable program storage device of claim 23, wherein said determining exposure dose gain factor includes determining change in said measured attributes of said substrates per unit of exposure dosage.

29. The computer readable program storage device of claim 27, further including providing a user interface to communicate information regarding at least one of said exposure apparatus, said pre-exposure apparatus, said post-exposure apparatus, said correction maps, said processing module information, said metrology information, said substrate history, said exposure dosage gain factor, said measured substrate attributes, and said logical mechanism.

30. The computer readable program storage device of claim 22, further including, acquiring processing module information based on information of specific apparatus of said pre-exposure apparatus and post-exposure apparatus and processing paths used in processing said substrates, acquiring metrology information including information associated with said specific apparatus of said pre-exposure apparatus and post-exposure apparatus used in processing said substrates, determining exposure dosage gain factor including calculating change in said measured attributes of said substrates per unit of exposure dosage, acquiring history of previously-processed substrates, correlating each of said correction maps to at least one of said processing module information, said metrology information, said substrate history, said exposure dosage gain factor, and said measured substrate attributes, iteratively calculating and updating said corrective exposure data based on at least one of said processing module information, said metrology information, said substrate history, said exposure dosage gain factor, and said measured substrate attributes, and providing a logical mechanism, wherein said logical mechanism monitors, controls, and enables said iterative corrective exposure data calculation and updating to continue until said substrate attributes are determined to be uniform upon determining that said substrate attributes are uniform, and wherein said logical mechanism initiates invocation of corrective exposure data calculation and updating upon determining that said substrate attributes are no longer uniform.

* * * * *